(12) United States Patent
Slafer

(10) Patent No.: US 10,546,607 B2
(45) Date of Patent: *Jan. 28, 2020

(54) REPLICATION TOOLS AND RELATED FABRICATION METHODS AND APPARATUS

(71) Applicant: MicroContinuum, Inc., Cambridge, MA (US)

(72) Inventor: W. Dennis Slafer, Arlington, MA (US)

(73) Assignee: MicroContinuum, Inc., Cambridge, MA (US)

(*) Notice: Subject to any disclaimer, the term of this patent is extended or adjusted under 35 U.S.C. 154(b) by 56 days.

This patent is subject to a terminal disclaimer.

(21) Appl. No.: 15/213,907

(22) Filed: Jul. 19, 2016

(65) Prior Publication Data

US 2016/0329075 A1 Nov. 10, 2016

Related U.S. Application Data

(62) Division of application No. 13/302,098, filed on Nov. 22, 2011, now Pat. No. 9,395,623, which is a division
(Continued)

(51) Int. Cl.
*B41N 7/00* (2006.01)
*G03F 7/00* (2006.01)
(Continued)

(52) U.S. Cl.
CPC .......... *G11B 7/263* (2013.01); *B29C 33/3857* (2013.01); *B29C 59/04* (2013.01);
(Continued)

(58) Field of Classification Search
None
See application file for complete search history.

(56) References Cited

U.S. PATENT DOCUMENTS 2,706,175 A 4/1955 Licharz
3,617,351 A 11/1971 Long et al.
(Continued)

FOREIGN PATENT DOCUMENTS

CA 2504369 12/2003
DE 2708039 4/1979
(Continued)

OTHER PUBLICATIONS

Definition of Lathe, from Answers.com; 2009.
(Continued)

*Primary Examiner* — Joshua D Zimmerman
(74) *Attorney, Agent, or Firm* — Cesari and McKenna, LLP

(57) ABSTRACT

Durable seamless replication tools are disclosed for replication of seamless relief patterns in desired media, for example in optical recording or data storage media. Methods of making such durable replication tools are disclosed, including preparing a recording substrate on the inner surface of a support cylinder, recording and developing a relief pattern in the substrate, creating a durable negative relief replica of the pattern, extracting the resulting durable tool sleeve from a processing cell, and mounting the tool sleeve on a mounting fixture. Apparatus are disclosed for fabricating such seamless replication tools, including systems for recording a desired relief pattern on a photosensitive layer on an inner surface of a support cylinder. Also disclosed are electrodeposition cells for forming a durable tool sleeve having a desired relief pattern. The replication tool relief features may have critical dimensions down to the micron and nanometer regime.

5 Claims, 6 Drawing Sheets

Related U.S. Application Data of application No. 11/814,175, filed as application No. PCT/US2006/002060 on Jan. 20, 2006, now Pat. No. 8,062,495.

(60) Provisional application No. 60/645,714, filed on Jan. 21, 2005.

(51) Int. Cl.

| | |
|---|---|
| B29C 59/04 | (2006.01) |
| B82Y 10/00 | (2011.01) |
| B82Y 40/00 | (2011.01) |
| G03F 7/24 | (2006.01) |
| G11B 7/26 | (2006.01) |
| C25D 1/02 | (2006.01) |
| C25D 1/10 | (2006.01) |
| C25D 21/02 | (2006.01) |
| C25D 17/02 | (2006.01) |
| C25D 17/04 | (2006.01) |
| C25D 21/10 | (2006.01) |
| C25D 21/06 | (2006.01) |
| C25D 5/02 | (2006.01) |
| B29C 33/38 | (2006.01) |
| C25D 7/04 | (2006.01) |
| C25D 17/12 | (2006.01) |
| C25D 3/04 | (2006.01) |
| C25D 3/12 | (2006.01) |
| C25D 3/46 | (2006.01) |
| C25D 3/48 | (2006.01) |
| C25D 17/06 | (2006.01) |
| B29L 31/00 | (2006.01) |

(52) U.S. Cl.
CPC ............... *B41N 7/00* (2013.01); *B82Y 10/00* (2013.01); *B82Y 40/00* (2013.01); *C25D 1/02* (2013.01); *C25D 1/10* (2013.01); *C25D 3/04* (2013.01); *C25D 3/12* (2013.01); *C25D 3/46* (2013.01); *C25D 3/48* (2013.01); *C25D 5/02* (2013.01); *C25D 5/022* (2013.01); *C25D 7/04* (2013.01); *C25D 17/02* (2013.01); *C25D 17/04* (2013.01); *C25D 17/06* (2013.01); *C25D 17/12* (2013.01); *C25D 21/02* (2013.01); *C25D 21/06* (2013.01); *C25D 21/10* (2013.01); *G03F 7/0002* (2013.01); *G03F 7/24* (2013.01); *G11B 7/26* (2013.01); *G11B 7/261* (2013.01); *B29L 2031/757* (2013.01)

(56) References Cited

U.S. PATENT DOCUMENTS

| | | |
|---|---|---|
| 4,049,413 A | 9/1977 | French |
| 4,102,756 A | 7/1978 | Castellani et al. |
| 4,125,447 A | 11/1978 | Bachert |
| 4,286,860 A | 9/1981 | Gursky et al. |
| 4,309,455 A | 1/1982 | Miyagawa |
| 4,372,829 A | 2/1983 | Cox |
| 4,426,311 A | 1/1984 | Vander Mey |
| 4,428,761 A | 1/1984 | Howard et al. |
| 4,478,769 A | 10/1984 | Pricone et al. |
| 4,871,623 A | 10/1989 | Hoopman et al. |
| 4,923,572 A | 5/1990 | Watkins et al. |
| 5,147,763 A | 9/1992 | Kamitakahara |
| 5,408,308 A | 4/1995 | Allegretto et al. |
| 5,496,463 A | 3/1996 | Mori et al. |
| 5,517,338 A | 5/1996 | Vaughn et al. |
| 5,521,030 A | 5/1996 | McGrew |
| 5,524,342 A | 6/1996 | Swain et al. |
| 5,575,961 A | 11/1996 | Kuwabara et al. |
| 5,872,758 A | 2/1999 | Put et al. |
| 5,874,363 A | 2/1999 | Hoh et al. |
| 5,879,855 A | 3/1999 | Schadeli et al. |
| 5,906,912 A | 5/1999 | Watanabe et al. |
| 6,017,657 A | 1/2000 | Mentz et al. |
| 6,045,980 A | 4/2000 | Edelkind et al. |
| 6,113,769 A | 9/2000 | Uzoh et al. |
| 6,183,610 B1 | 2/2001 | Kataoka et al. |
| 6,222,157 B1 | 4/2001 | Langille et al. |
| 6,241,228 B1 | 6/2001 | Chupick |
| 6,258,251 B1 | 7/2001 | Gowans et al. |
| 6,309,799 B1 | 10/2001 | Ruckl |
| 6,790,377 B1 | 1/2004 | Cohen |
| 6,703,095 B2 | 3/2004 | Busshoff et al. |
| 7,132,158 B2 | 11/2006 | Brenneman et al. |
| 7,674,103 B2 | 3/2010 | Slafer |
| 7,833,389 B1 | 11/2010 | Slafer |
| 8,062,495 B2 * | 11/2011 | Slafer .......................... 205/67 |
| 8,435,373 B2 | 5/2013 | Slafer |
| 8,535,041 B2 | 9/2013 | Slafer |
| 9,039,401 B2 | 5/2015 | Slafer |
| 2001/0038072 A1 | 11/2001 | Aumond et al. |
| 2002/0100553 A1 | 8/2002 | Toyoda |
| 2003/0033949 A1 * | 2/2003 | Salvestro ................. B41C 1/05 101/401.1 |
| 2003/0059578 A1 | 3/2003 | Williams et al. |
| 2004/0005423 A1 | 1/2004 | Dalton et al. |
| 2004/0266207 A1 | 12/2004 | Sirringhauss et al. |
| 2005/0069480 A1 | 3/2005 | Huang et al. |
| 2005/0167276 A1 | 8/2005 | Stilli |
| 2005/0274693 A1 | 12/2005 | Heidari et al. |
| 2006/0283539 A1 | 12/2006 | Slafer |
| 2007/0022096 A1 | 9/2007 | Slafer |
| 2008/0261478 A1 | 10/2008 | Cok et al. |

FOREIGN PATENT DOCUMENTS

| | | |
|---|---|---|
| EP | 0264341 | 4/1988 |
| EP | 0557998 | 9/1993 |
| EP | 0762721 | 3/1997 |
| EP | 0889366 | 1/1999 |
| JP | 57143484 | 9/1982 |
| JP | 60047846 | 3/1985 |
| KR | 616105 | 8/2006 |
| WO | 199006234 | 6/1990 |
| WO | WO05/072242 | 8/2005 |
| WO | WO05/072936 | 8/2005 |
| WO | 2006078918 | 7/2006 |

OTHER PUBLICATIONS

International Search Report and Written Opinion received in PCT Application PCT/US07/076708.
International Search Report from PCT Application No. PCT/US2009/31876.
Land, "An Introduction to Polavision," Photographic Science and Engineering, 21:225-236 (1977).
Supplementary EP Search Report from Corresponding EP Application No. 06719038.
Written Opinion from related PCT Application No. PCT/US09/31876.
Slafer, W. Dennis et al, "Continuous Manufacturing of thin cover sheet optical media", SPIE—The International Society for Optical Engineering, Feb. 9-14, 1992, pp. 324-335, vol. 1663, Society of Photo-Optical Instrumentation Engineers, Bellingham, Washington.

* cited by examiner

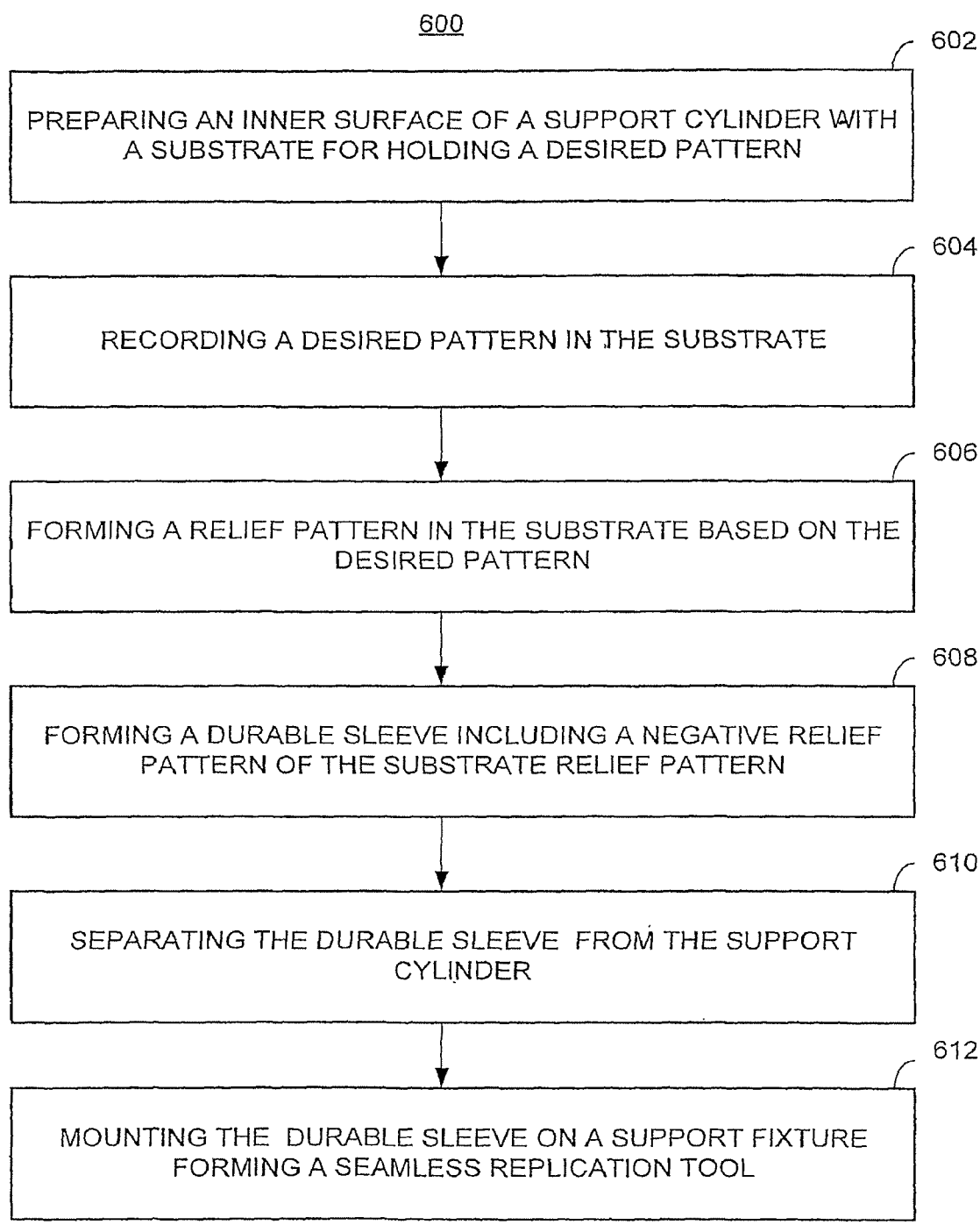

REPLICATION TOOLS AND RELATED FABRICATION METHODS AND APPARATUS

RELATED APPLICATIONS

This application is a divisional application of U.S. patent application Ser. No. 13/302,098, filed Nov. 22, 2011, now U.S. Pat. No. 9,395,623, which is a divisional application of U.S. patent application Ser. No. 11/814,175, filed Aug. 4, 2008, now U.S. Pat. No. 8,062,495, which claims priority to PCT/US2006/002060 filed Jan. 20, 2006, which claims the benefit of U.S. Provisional Application No. 60/645,714 filed 21 Jan. 2005, the contents of all of which are incorporated in their entirety herein by reference.

BACKGROUND

Optical data storage media including compact discs (CDs) and digital video discs (DVDs) contain physical relief structures that are used by an optical read/write head to obtain position and tracking information, error correction, conveying data content, etc. These relief structures are created during the optical disc manufacturing process and typically include very fine surface modulations. The surface modulations are often in the form of pits, bumps, grooves, or lands, etc., and can include features with submicron-scale down to nanometer-scale dimensions. The process of incorporating such features into the substrate of the optical medium during manufacturing is variously referred to as "preformatting" or "replication." The benefits of preformatting include very efficient utilization of the optical disc surface, which in turn allows higher storage capacity and enhanced performance compared to media without such formatting.

The standard process for incorporating such information structures into the surface of optical disc substrates is injection molding, wherein pellets of a polymeric material, usually polycarbonate, are melted and injected into a mold containing an insert, or stamper, which has the mirror image of the desired pattern on its surface and against which the melted polymeric substrate material is brought into contact. Cooling of the mold allows the polymer material to solidify, at which point the substrate disc, now having the information formed into its surface, is removed.

In the case of optical media designed for recording/rewriting of user data, the molded features typically contain various format and header addressing information to help locate the user data, and additionally may contain other features, including those relating to prerecorded information, often referred to as read-only memory (ROM) information.

Although the injection molding process described above is the virtually exclusive manufacturing process used worldwide for making optical discs, a number of attempts have been made to fabricate data storage substrates by means other than injection molding, including continuous roll processing. For an article on continuous roll processing, see W. D. Slafer at al., "Continuous Web Manufacturing of thin-coverslip optical media", SPIE Optical Data Storage '92, San Jose, Calif., 12 Feb. 1992. Such roll processes have involved a rotary or step-and-repeat replication process, either of which utilizes a replication tool whose surface contains the mirror image of the desired pattern, and which is used to create multiple replicas of the tool pattern.

There are a number of techniques known in the art whereby embossing tools used in the roll processes can be created, including direct etching on the external surface of the tool, or use of a flat substrate that is attached to the outer surface of a support member, patterned or patterned after mounting. See, for example, U.S. Pat. Nos. 5,521,030 and 5,147,763. It is further known that such tooling can be formed from discrete elements, whereby several substrates containing a pattern to be replicated can be joined, as in the form of a mosaic pattern, for example, and thereby increase the size of the tool.

Many of the techniques of the prior art described above include the inevitable creation of one or more joints or seams where substrate edges abut. The resulting master replication tool exhibits a discontinuity (seam) at the location at which the discrete pieces are joined. Such seams do not represent a limitation in applications in which the desired pattern to be replicated is by design composed of discreet elements (such as discs and cards), since the seam(s) can merely be placed between the natural divisions of these discrete elements. For other applications, the visual effects of the seam(s) can be reduced by techniques known in the art so as not to be noticeable or objectionable for a particular application, for example holographic designs or embossed foils for wrapping and packaging and the like. The discontinuities introduced by the existence of one or more seams, however, can present limitations in other applications in which a recording medium requires a format with a relatively long dimension compared to the replication tool, e.g., such as optical storage tape.

In addition to cosmetic effects, a discontinuity such as a seam that is made by the replication tool can often cause mechanical problems during the replication process, and techniques known in the art have been developed to reduce the seam, including careful piecing of the segments, grinding, polishing, etc. For some applications, such techniques are not acceptable, for example micropatterns that require a pattern without interruption for long distances, such as lenticules for photographic films and preformatted recording tape. See E. H. Land, "An Introduction to Polavision", Photogr. Sci. Eng. 21: 225 (1977).

Examples of previous techniques of producing true seamless patterning tools have involved producing a mirror image of the desired pattern on the external face of a geometric surface, such as a drum, by engraving or by lithographic techniques, e.g., as taught in U.S. Pat. No. 6,045,980. These previous techniques, however, suffer from the drawback that the replica surface is often made of materials that are not durable (glass, photopolymer, etc.) or cannot be readily replicated. A direct (molded) copy of such an external master pattern would by necessity have the pattern facing inward, and attempting to "invert" such a tool, for example by slitting to turn it "inside out," would by necessity introduce a seam.

Other examples of processes for making replication tools suitable for optical recording media involve spiral wrapping of a discreet tape over the outer surface of a sleeve to create an external pattern. See, for example, U.S. Pat. No. 5,872,758. This technique does not eliminate discontinuities, however, and suffers from the limitation of creating multiple diagonal seams on the substrate being imprinted.

What are desirable, therefore, are methods and apparatus that address the shortcomings noted for the prior art.

SUMMARY

The present disclosure is directed to methods and apparatus that substantially or altogether eliminate the shortcomings and disadvantages of the prior art as noted above. Certain embodiments of the present disclosure are directed to durable seamless replication tools for replication of one or more continuous and seamless predetermined patterns in a substrate. The substrate can be rigid or flexible. In certain embodiments, a substrate can include a layer of liquid polymer that can be cured or hardened to receive the predetermined seamless pattern of the tool. Other embodiments of the present disclosure are directed to methods and apparatus for fabricating such seamless replication tools.

Exemplary embodiments of continuous and seamless durable replication tools as described herein may provide the capability of forming a continuous pattern capable of having features with critical dimensions down to the micron and nanometer regimes on a substrate of arbitrary length, e.g., a substrate for preformatted tape, and the like.

These and other features of the present disclosure will be more clearly apparent from the following description when taken in conjunction with the accompanying drawings.

BRIEF DESCRIPTION OF THE DRAWINGS

Various aspects of the disclosure itself may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 6 is a diagram showing steps in a method of fabricating a seamless replication tool according to a further embodiment of the present disclosure.

DETAILED DESCRIPTION

The following description refers to several possible embodiments of the present invention. It should be understood by one skilled in the art that variations of the embodiments described herein may be envisioned, and such variations and improvements thereon are intended to fall within the scope of the invention.

Certain embodiments of the present disclosure are directed to durable seamless replication tools for replication of seamless relief patterns in desired media, such as, for example in optical recording or data storage media. Further embodiments are directed to methods of making such durable replication tools and may include preparation of a recording substrate on an inner surface of a support cylinder, recording and developing a pattern in the substrate, creation of a durable negative-relief replica of the pattern, extraction of the resulting durable tool sleeve from a processing cell, and mounting the tool on a mounting fixture.

Further embodiments of the present disclosure are directed to apparatus for fabricating such seamless replication tools. Certain embodiments are directed to systems that utilize a radiation source to record a desired relief pattern on a photosensitive layer on an inner surface of a support cylinder. Other embodiments of the present disclosure are directed to electrodeposition cells for plating a support cylinder having a relief pattern and forming a durable tool sleeve having a corresponding negative-relief pattern. Exemplary embodiments of continuous and seamless durable replication tools as described herein may provide the capability of forming a continuous pattern with features having critical dimensions down to the micron and nanometer regime on a substrate of arbitrary length, e.g., a substrate for preformatted optical tape, and the like.

Figure 1:
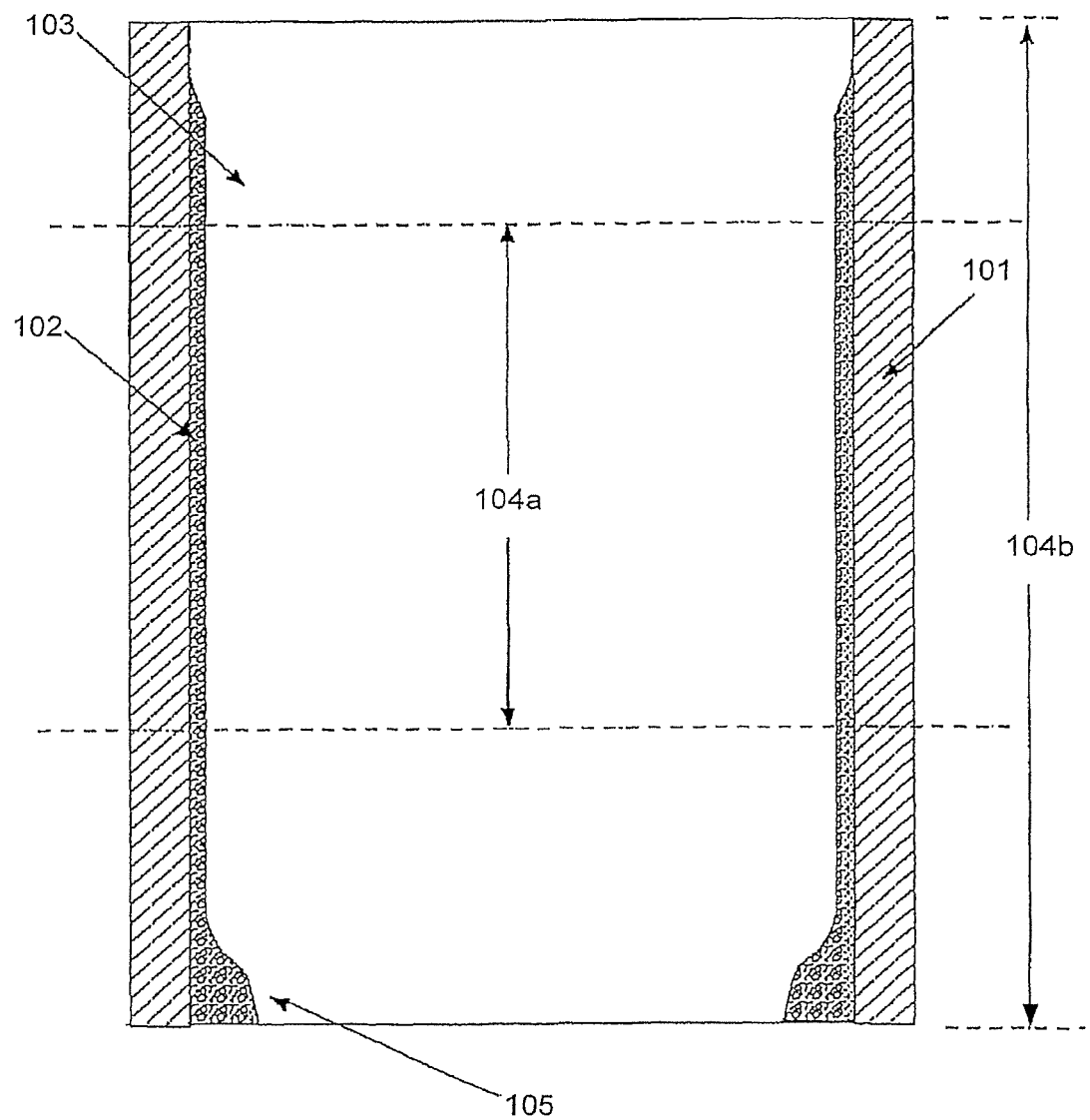
FIG. 1 is a schematic drawing showing a cross section of a support cylinder according to an embodiment of present disclosure with a photosensitive layer on an inner surface.

FIG. 1 is a schematic drawing showing a cross section of a support cylinder according to an embodiment 100 of the present disclosure with a photosensitive layer on an internal surface. The support cylinder 101 may be a seamless cylinder of glass, metal, plastic etc. The inner surface of the support cylinder 101 is coated with a substrate or layer 102 of a light-sensitive polymer (such as Shipley AZ photoresist, or the like). Such a layer 102 can be applied by any of a number of techniques, including but not limited to dipping the cylinder 101 in a bath or reservoir of suitable photoresist, drawing the cylinder 101 out of such a bath, draining the bath at a desired rate, spraying photoresist at one end 103 the support cylinder 101, and/or spinning the support cylinder 101 to spread the photoresist, etc. The area 104a represents that portion of layer 102 having substantially uniform thickness, and 104b represents the uninterrupted length of the support, that is, a length without segmentation or mechanical seams or joints, etc. which could create an interruption to the flow of the photoresist and result in a non-uniform coating at or near such a joint.

The photoresist layer 102 is suitable for recording and holding a desired pattern. In an exemplary embodiment, the cylinder 101 may be fabricated to be longer in dimension along its cylindrical axis 104b than the length of the desired, finished pattern 104a. The support cylinder 101 containing the desired patter (or latent image) may be processed to create a surface relief pattern in the photoresist. Such development processing can be accomplished by suitable techniques, including for example, removing the exposed cylinder from its mounting fixture and placing the photoresist layer in contact with an appropriate development means, such suitable solvent, photoresist developer, or etchants, and the like. It may also be appreciated that alternative techniques of recording the desired pattern may also be used, such as laser ablating of material vacuum deposited on the inner surface of the support cylinder.

The cylindrical inner surface of the support cylinder 101, when holding a relief pattern, may be used to form a mirror-image replica or negative-relief pattern in a durable cylindrical surface suitable for use in preformatting media. This replication of the original relief pattern can be accomplished by a number of techniques, including electroless plating, electrolytic plating, electroforming, physical vapor deposition, chemical vapor deposition, epoxy replication, radiation cross-linking, casting, etc. In an exemplary embodiment, a durable replica may be created by means of an electrodeposition process, such as nickel electroforming.

Figure 2:
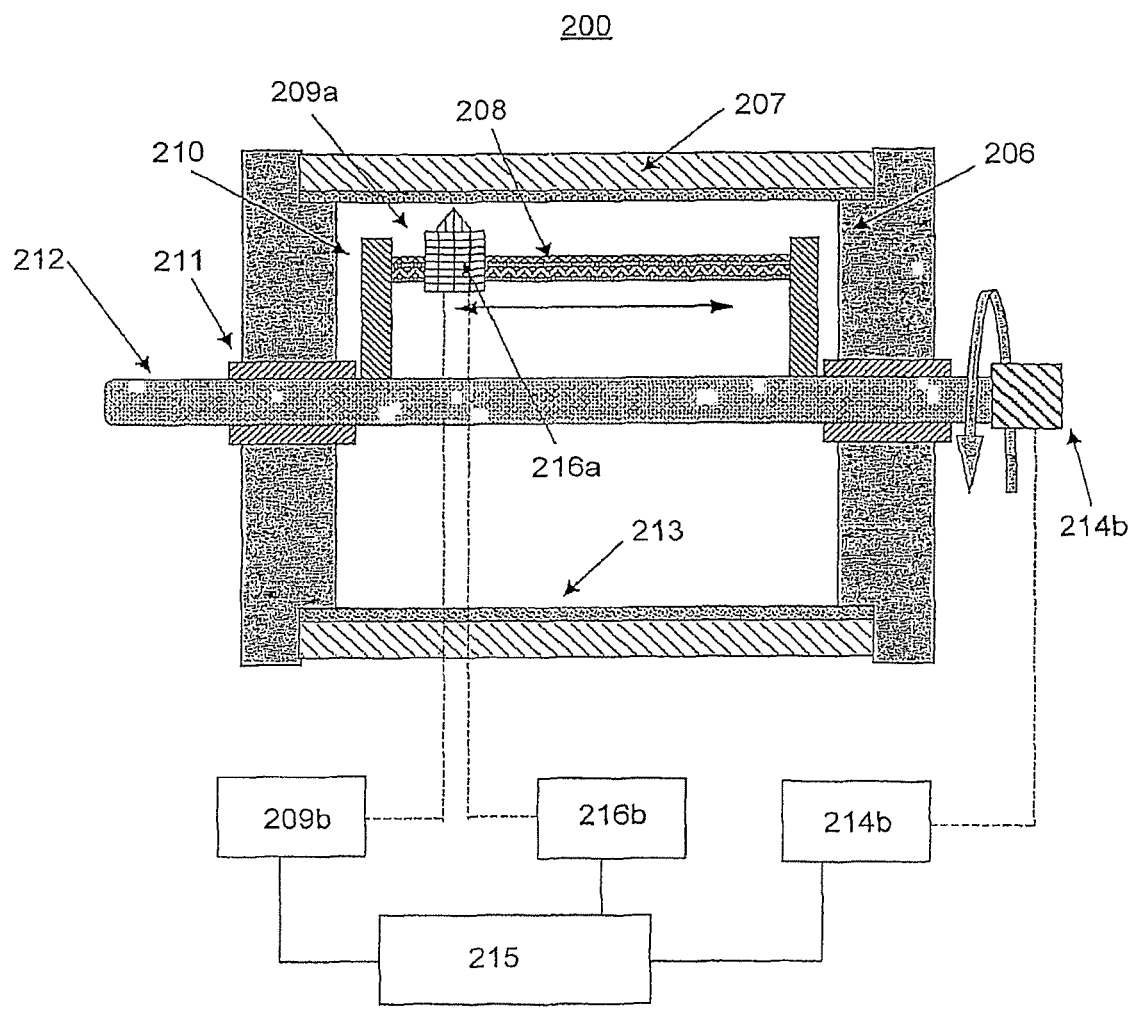
FIG. 2 is a schematic drawing showing a cross section of an apparatus according to a further embodiment including a movable radiation source for recording information-bearing features on an inner surface of a photoresist-coated support cylinder.

FIG. 2 is a schematic drawing showing a cross section of an apparatus 200 according to a further embodiment that includes a movable radiation source for recording a desired pattern, e.g., information-bearing features, on the inside surface 213 of a photoresist-coated support cylinder 207. One or more centralizing end bells, or disks, 206 may be affixed to cylinder 207 for holding the cylinder. One or more support members may be present to support the support cylinder, and may be connected to the one or more end bells. In exemplary embodiments, the assembly is rotatable about a support member in the form of a central shaft 212 extending through bearings 211. The rotation may be effected by motor 214b, which in turn may be controlled by rotation controller 214a. To facilitate improved precision and accuracy in patterning, the bearings may air bearings in exemplary embodiments.

The desired pattern may be formed in the photoresist substrate 213 by an optical head assembly 209a, as shown. The optical head assembly 209a may include a suitable optical source of coherent or incoherent light. In exemplary embodiments, the optical source is a laser. The optical output, e.g., laser output beam, produced by the optical head assembly 209a may be modulated by controller 209b. The head assembly 209a may include autofocus and other control circuitry as necessary to maintain the position and uniformity of the optical output beam. Translation of head assembly 209a may be accomplished by means of a linear actuator 216a, which in turn may be controlled by a suitable position controller 216b. In exemplary embodiments, the head assembly 209a may be movable along a frame and/or track, a portion of which extends parallel to the longitudinal or central axis of the support cylinder 207.

To produce relative movement between the optical head assembly 209a and the cylinder 207, which is coated with photoresist coating 213, the cylinder 207 may be rotated about its central shaft 212 while the optical head 209a is simultaneously translated along the direction of the longitudinal axis of the cylinder 207. During such motion, the output of the optical head 209a can be modulated to produce exposure of the photoresist 213 according to the desired pattern. Smooth continuous motion can be used to produce a spiral pattern, and intermittent rotation and translation can be used to produce concentric patterns. Rotation, translation, and optical head (e.g., laser) control may be synchronized and programmed through a master controller device 215, which may include a suitable programmable logic controller (PLC), or computer, or the like. It may also be appreciated that alternative techniques for moving the exposure beam with respect to the substrate may be used, such as holding the exposure source steady and rotating and translating the cylinder, or rotating the exposure beam and translating the cylinder, etc.

Figure 3:
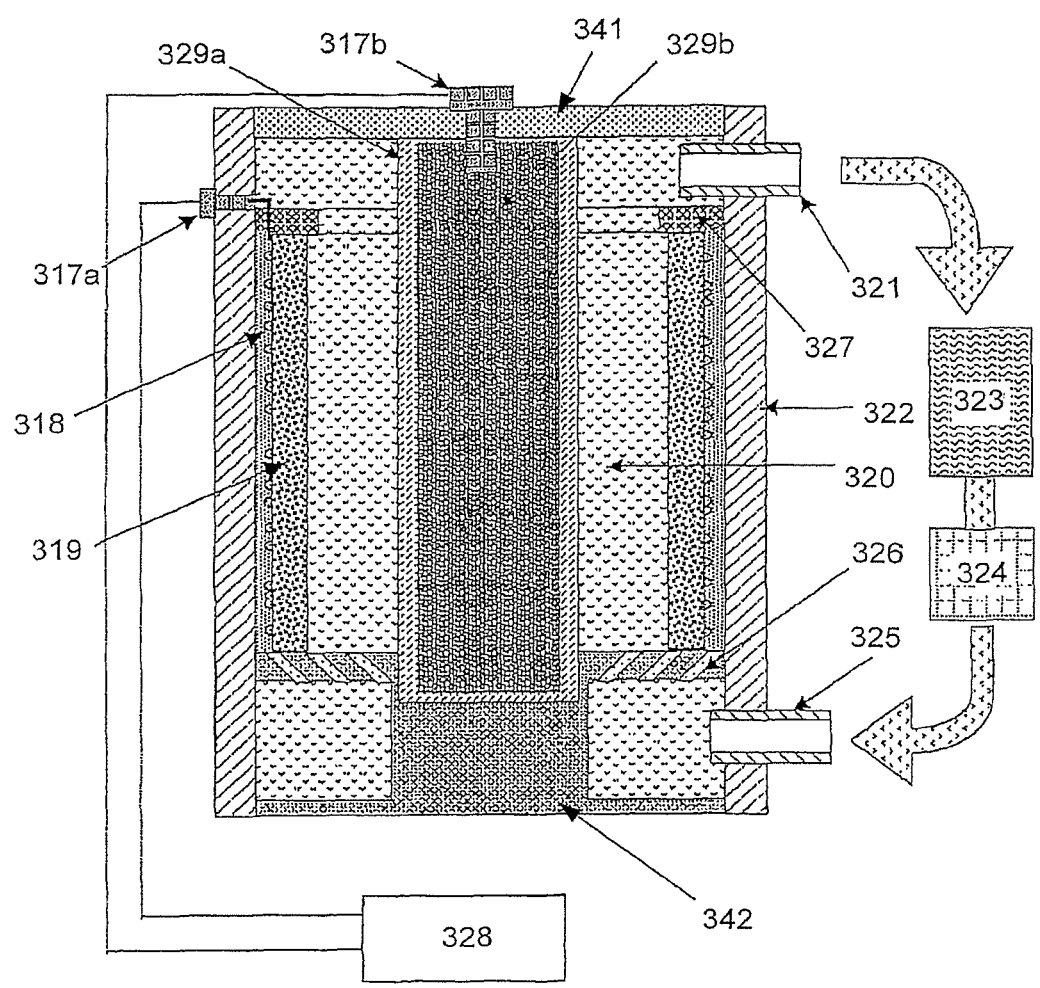
FIG. 3 is a schematic drawing showing a cross section of an electrochemical deposition cell in accordance with a further embodiment that may be used to make durable pattern replication tools having a negative-relief replica of a pattern formed on an inner surface of a support cylinder.

FIG. 3 is a schematic drawing showing a cross section of an electrochemical deposition cell, or deposition system, 300 in accordance with a further embodiment of the present disclosure. A cylinder 322 of the system 300 may be sized and adapted to securely hold a support cylinder 318 having a relief patter on its inner surface, such as described previously for FIGS. 1 and 2. First and second end disks 341, 342 may be present to seal cylinder 322 to circulate a metal-containing solution suitable for electrochemical or electroless plating. The deposition system 300 may be used to make a durable sleeve with an inverse or negative of the relief pattern on the inner surface of a support cylinder. The resulting durable sleeve may be used for a replication tool, as described in further details for FIGS. 5 and 6, below.

With continued reference to FIG. 3, system 300 may include a closed recirculating system including a reservoir 323 from which a metal-containing solution is pumped, an in-line filtration system or filter 324 to remove any particulate and other unwanted matter, and heating elements (not shown) by which the reservoir 323 is caused to reach and maintain a desired operating temperature. The system 300 may include suitable pumping and valving means to allow the metal-containing solution to continuously circulate under controlled (and monitored) conditions.

The metal-containing solution (e.g., nickel sulfamate in the case of the Ni electroforming process) 320 circulates through cylinder 322 as part of a plating process. The solution may be heated in reservoir 323 and passed through filtration unit 324 before entering the cell at location 325. The support cylinder 318 in which the photoresist is coated may serve as a part (e.g., a boundary wall) of the deposition and fluid recirculation pathway. In exemplary embodiments, the solution exits the cell at the top outflow pipe 321 and returns to reservoir 323 for reconditioning and recirculation to the cell. One or more non-conductive stop rings 327 may be located on the substrate, e.g., toward one end of the cell, to facilitate definition of the ends of the deposited replica by inhibiting the deposition process at this surface.

A spiral distribution flow director 326 may, as shown, optionally be present at the bottom of the cell to create a fluid vortex pattern within the cell 300 to facilitate a higher flow velocity near the cylinder wall. Such a flow improvement may facilitate thorough mixing of the solution, as well as dislodging and sweeping away of bubbles or other byproducts or impurities from the inside walls of the cylinder 322.

Also shown in FIG. 3 is an optional electrical circuit for the electrochemical cell 300 including two electrodes for electrodeposition embodiments of the cell 300. The inner surface of the pattern-containing support cylinder is coated with a thin coating of electrically conductive material (not shown). The electrically conductive inner surface 318 of the support cylinder forms a portion of a first electrode of the electrical circuit of the cell 300 and may be deposited by processes known to the art, including vacuum and electroless deposition. The first electrode is connected via terminal 317a to power supply 328. A suitable second electrode 329b, such as a nickel assembly, may be positioned within cylinder 322 and may be connected through terminal 317b to power supply 328. Circulation of the electrolyte within the cylinder 322 provides an electrical path between the electrodes and the power supply and completes the electrical circuit. In exemplary embodiments, electrode 329b is made from Ni pellets (or solid rod or the like) in a titanium basket, which in turn is surrounded by a filter bag 329a to retain any particulates produced as byproducts of the electroforming process.

To electroplate the inner surface of the support cylinder 318 and thereby form a durable sleeve including a replica relief pattern, current passes through the electrolyte solution between the electrodes. In accordance with Faraday's Law, the thickness of the deposited metal (e.g., nickel) layer 319 is proportional to the total charge passed through the cell, as is known in the art of electroplating. The process can be terminated after any length of time, where the thickness of the deposited layer is thereby proportional to the cumulative amount of current passed through the cell, as well as other factors, and which typically may range from a few microns to many millimeters in thickness. When the thickness of the deposit has reached the desired value, such as 0.010 inches for one example, the electrodeposition process may be terminated by removing the voltage, draining and disassembling the cell 300.

Figure 4:
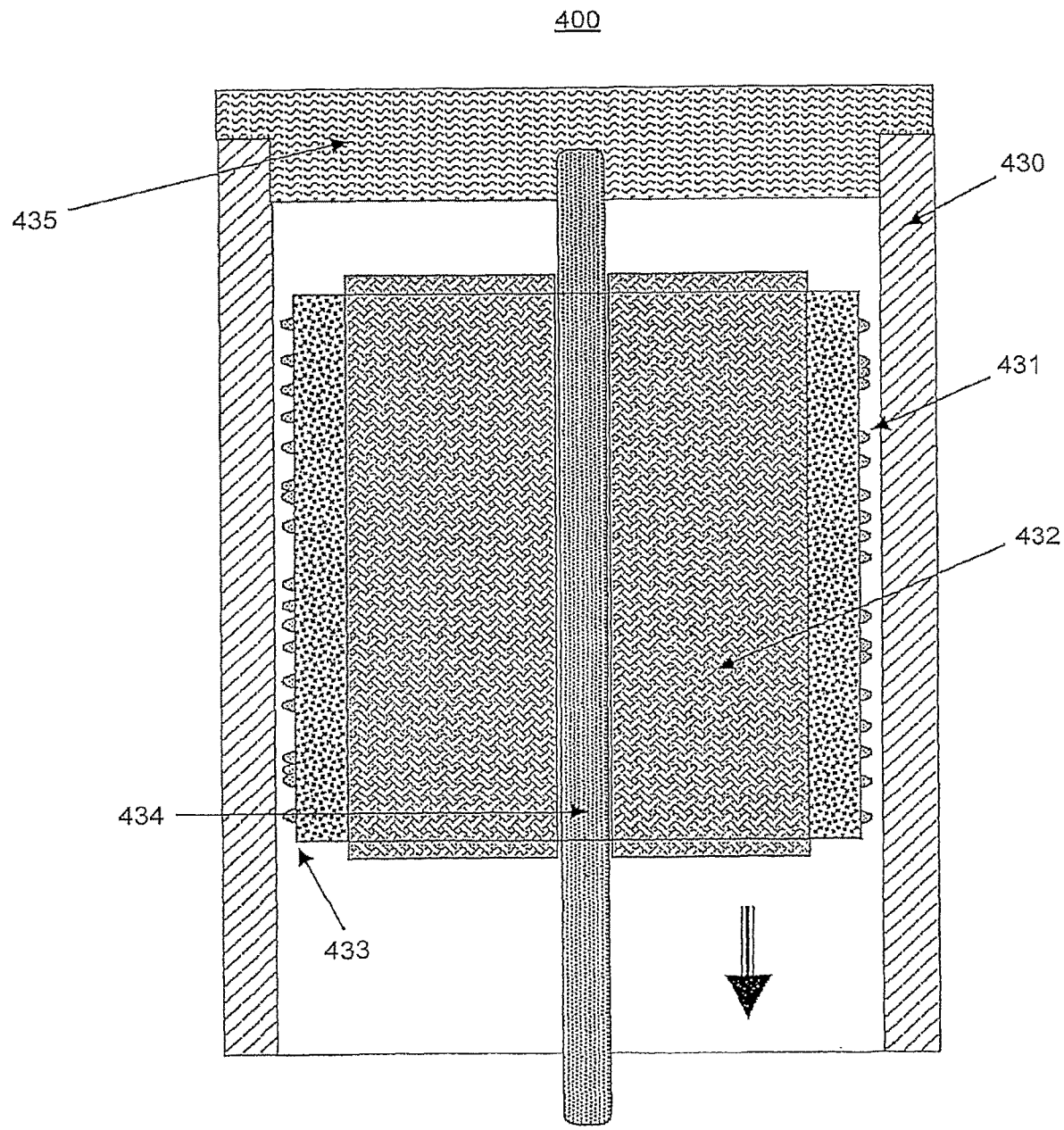
FIG. 4 is a schematic drawing showing a cross section of an apparatus according to a further embodiment that may be used to remove a replication tool sleeve from an electroplating deposition cell.

FIG. 4 is a schematic drawing showing a cross section of an apparatus 400 according to a further embodiment that may be used to remove the sleeve of a replication tool from a an electrochemical deposition cell. A cylindrical support cylinder is shown 430 surrounding an inner sleeve 431 that contains a replica relief pattern, e.g., as made by system 300 of FIG. 3. Element 432 is a centering device that is mounted in center flange 435, and operates to center sleeve 431 and shaft 434. The flange 455 provides precise alignment of the axes of the sleeve 431 in the cylinder 430, and thereby prevents damage to the outer pattern of the replica sleeve during the process of separation of replica tool 431 from cylinder 430. Element 432 may be an expandable arbor, e.g., an inflatable elastomeric device or a mechanical expansion device, etc.

The replica sleeve may be separated by suitable techniques, e.g., as described for FIG. 6. For example, the sleeve may be separated by introducing a photoresist solvent or photoresist developer to the space 433 between the outer tool surface and the inner wall of the support sleeve (the space occupied by the photoresist, e.g., layer 318 in FIG. 3). After the solution has penetrated and dissolved the photoresist, the tool sleeve may be separated by means of sliding assembly 432 on shaft 434. Any residual photoresist or other contaminant material can be removed from the external patterned surface of the tool by cleaning as necessary. By centering the sleeve and the support cylinder about the same central axis and then separating the sleeve and cylinder apart along this axis, damage to the relief pattern on the sleeve surface can be prevented or minimized for the separation process. Separating the replication tool from the support cylinder may include cooling or heating the support cylinder or replication tool to cause differential expansion between the supports cylinder and replication tool.

Figure 5:
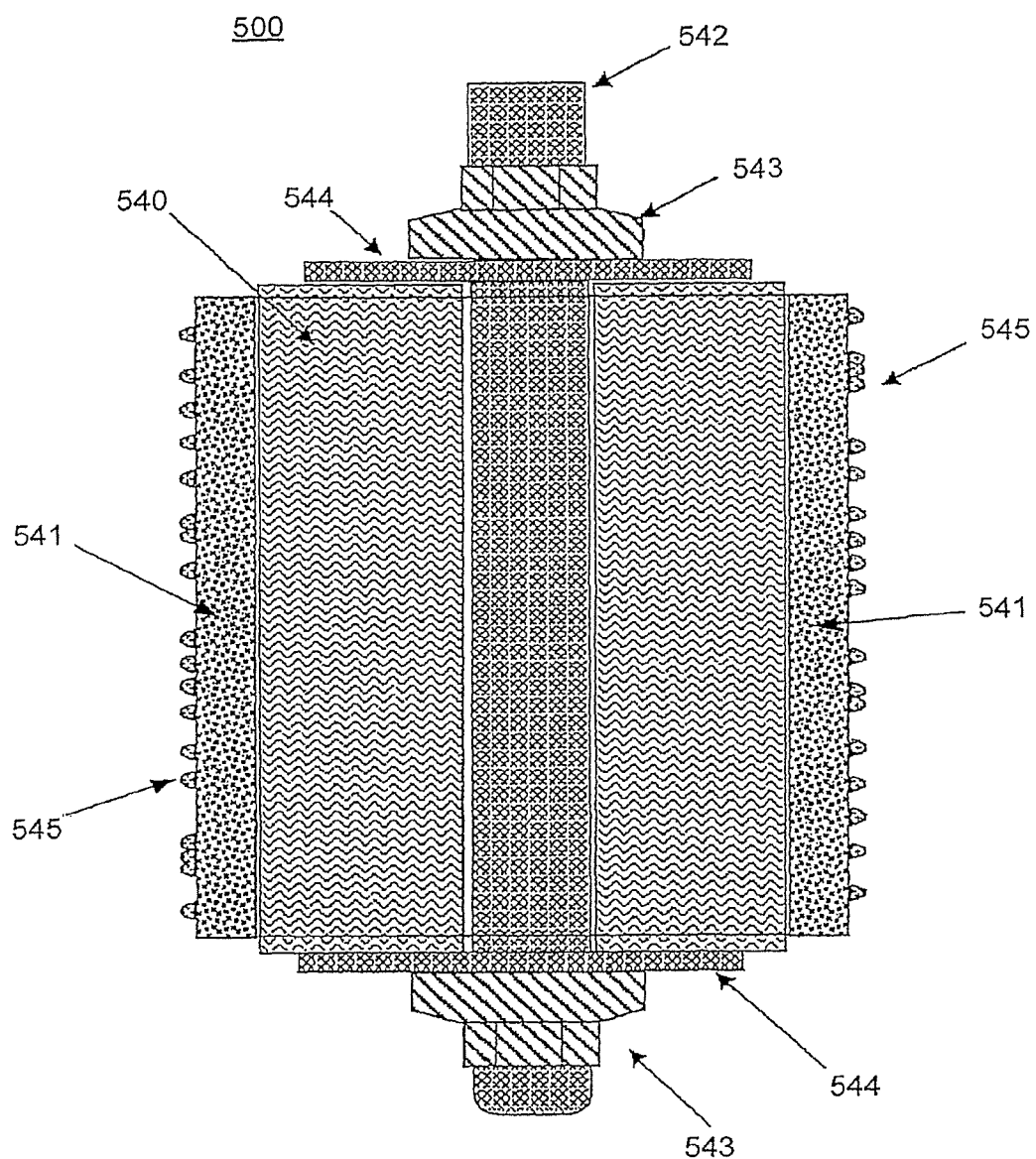
FIG. 5 is a replication tool according to another embodiment of the present disclosure, including a support fixture.

FIG. 5 shows a replication tool 500 according to the present disclosure, including a support fixture. A thick-walled cylindrically-shaped elastomeric insert piece 540 is inserted into sleeve 541 over shaft 542 and compression nuts 543 are tightened against thrust washer 544 to compress elastomeric insert piece 540. The resultant shortening of the length of the insert piece 540 causes its outer diameter to concomitantly expand, thereby firmly capturing and securing tool sleeve 541. Removal of the tool sleeve 541 from the mounting fixture is accomplished by reversing this tightening process. The finished tool 500 may be suitable for use in replication machinery, and may allow rapid changing of the tool sleeve. The tool 500 may minimize the potential for contacting or otherwise damaging the outer surface holding the relief pattern 545 during the mounting process.

It should also be noted the support fixture shown in FIG. 5 can be used to extract the replica tool from the deposition cell 400 of FIG. 4. For example, the insert piece 540 may be inserted with the bore formed by the inner surface of the plating forming the replication tool. The associated compression nuts can be tightened so the insert piece 40 is pressed against and holds the replication tool sleeve. As the photoresist layer is removed, e.g., by a suitable solvent or developer, the support fixture holds the replication tool sleeve 541 and prevents damage to the pattern 545 on the outside surface of the tool sleeve 541, forming a completed replication tool suitable with which to imprint desired media.

Although the embodiments described above have indicated that a first pattern generated in photoresist on the inside of a cylinder may be used, it will be appreciated that the equivalent process can be carried out on the outside of a cylinder as well, where the subsequent process steps could include electroforming (for example) of an external pattern rather than an internal pattern, etc. Furthermore, it should be appreciated that any internally-patterned cylinder can be used as the pattern from which the desired tool is produced. Thus for example an internally-patterned Ni cylinder can be used to produce an externally-patterned Ni tool.

FIG. 6 is a diagram showing steps in a method 600 of fabricating a seamless replication tool according to a further embodiment of the present disclosure. An inner surface of a support cylinder is prepared for holding a desired relief pattern, as described at step 602. In an exemplary embodiment a light-sensitive polymer in the form of a photoresist fluid, such as previously mentioned, is poured in excess onto the inner wall of the support cylinder from the top opening (e.g., opening 3 in FIG. 1) such that the photoresist completely covers the inner wall below the top opening and is allowed to flow downward by gravity until a continuous film is formed. The evaporation of the diluent component of the resist, and hence the drying time, can be modulated as necessary to achieve a smooth surface by control of the ambient temperature or control of the solvent vapor pressure (by, for example, partially sealing the support structure against evaporation), which will effect the thickness and surface quality, among other things, of the photoresist layer. The layer thickness (e.g., as shown by layer 102 in FIG. 1) can be controlled by adjusting the weight ratio of solid material to diluent (solvent) in the photoresist composition. After sufficient drying time, the final preparation of the photoresist may involve heating or baking as required by the particular material.

A desired pattern may be formed or recorded in the substrate as described at step 604. In exemplary embodiments, radiation is applied the substrate by computer-controlled motion of a optical head assembly producing a laser output within the support cylinder, e.g., as shown and described for FIG. 2. In certain embodiments, translation of an optical head used to apply radiation may be accomplished by means of a linear actuator, which may be controlled by a position controller. Further, in an exemplary embodiment, the support cylinder with photoresist coating can be rotated about its central shaft while simultaneously translating an optical head along the direction of the axis of the cylinder. During this motion, the output of the optical head of an optical source (e.g., laser) can be modulated to produce the desired pattern by exposure of the photoresist. The rotation, translation, and laser control may be synchronized and programmed through master controller device, which may include a programmable logic controller (PLC), or computer, or the like.

The step of recording the desired pattern, described at step 604, may include other sources and configurations of light or radiation delivery and exposure of the photoresist, including the use of gas and/or solid state lasers, electron beams, focused ion beams, light emitting diodes (LEDs), incoherent light sources, fiber optic devices, and the like. Other configurations for recording a desired pattern on the photoresist are also envisioned by this disclosure, including relaying of the beam along the direction of the rotation axis of the cylinder to an assembly which re-directs and focuses the beam to the surface of the photoresist. It is also possible that both rotation and translation can be accomplished by movement of only the light head or source (either directly or as relayed by mirrors, etc.), or accomplished by rotation and translation of the cylinder only, or various combinations of the movements of the cylinder and the head or laser.

A relief pattern may be formed from the desired pattern, as described at step 606. Suitable methods for forming the relief pattern include applying a developer or solvent to the substrate to remove desired portions of the substrate, leaving the desired pattern in relief. Other suitable techniques may be used to recording the desired pattern may be used, such as laser ablating of material deposited on the sleeve surface, etc.

Continuing with the description of method 600, a hard and durable layer (e.g., of a suitable metal) may be applied over the substrate and relief pattern, as described at step 608, to form a durable and seamless replication tool sleeve. This step serves to form a mirror-image or negative relief pattern of the pattern on the substrate in a durable surface that is suitable for use in preformatting optical media. In exemplary embodiments, the step of applying a hard and durable sleeve layer includes forming a continuous layer of electrically conductive material on the substrate of the support cylinder and then plating the substrate by an electroplating or electrodeposition process, e.g., as described for FIG. 3. Application of the durable layer may be accomplished by other suitable techniques including, for example, electroless plating, electrolytic plating, electroforming, physical vapor deposition, chemical vapor deposition, epoxy replication, radiation cross-linking, casting, etc.

In exemplary embodiments, apparatus according to the embodiment described for FIG. 3 may be used for an electrodeposition process at step 608. For an electrodeposition process, the patterned surface of the resist may be made electrically conductive in order to serve as an electrode in the electrical circuit. Creation of a conductive surface over the (non-conductive) photoresist pattern can be achieved by suitable techniques including, for example, vacuum deposition, chemical reduction, chemical vapor deposition, etc. Such a conductive layer can be made of silver, gold, chrome, nickel, or any compatible conductive material or alloy, and is of such a thickness so as to ensure an electrically continuous layer, as necessary to obtain faithful pattern reproduction in the electroforming process. In other embodiments, the durable replica may be made by electroless deposition techniques, for example, electroless deposition of nickel (Ni) by immersion, etc.

After the durable layer including the negative relief pattern is made, the durable layer or sleeve may be removed or separated from the support cylinder, as described at step 610. In an exemplary embodiment, an centralizing element (e.g., element 432 in FIG. 4) and center flange (e.g., element 435 in FIG. 4) may be used to hold the sleeve and support cylinder. This is one of several possible embodiments of an assembly that insures precise alignment of the axes of the sleeve in the cylinder, which thereby prevents damage to the outer pattern of the replica during the process of separation of replica tool from cylinder.

The step of separating 610 the durable layer from the support cylinder may include introducing a photoresist solvent or photoresist developer to the space between the outer tool surface and the inner wall of the support sleeve (the space occupied by the photoresist, e.g., layer 18 in FIG. 3). After the solution has penetrated and dissolved the photoresist, the tool sleeve may be separated by a sliding assembly on the shaft. Any residual photoresist or other contaminant material can be removed from the external patterned surface of the replication tool by cleaning as necessary. By centering the sleeve and the support cylinder about the same central axis and then separating the sleeve and cylinder apart along this axis, damage to the relief pattern on the sleeve surface can be prevented or minimized for the separation process. Separating the replication tool from the support cylinder may include cooling or heating the support cylinder or replication tool to cause differential expansion between the supports cylinder and replication tool. An expandable arbor, e.g., an inflatable elastomeric device or a mechanical expansion device, etc, or other mounting fixture may be used for the separation process.

The seamless replication tool sleeve may be mounted on a support fixture, as described at step 612, to form a replication tool for imprinting the relief pattern on a desired medium, such as used for optical recording and data storage media. In an exemplary embodiment, a thick-walled cylindrically-shaped elastomeric insert piece, e.g., piece 40 of FIG. 5, may be inserted into the bore formed by the inner surface of the durable layer of the replication tool. The insert piece may be placed around a support shaft. Compression nuts may be tightened against respective thrust washers to compress an elastomeric insert piece. The resultant shortening of the length of the insert piece causes its outer diameter to concomitantly expand, thereby firmly capturing and securing the tool sleeve. Removal of the tool from the mounting fixture is accomplished by reversing this tightening process.

Accordingly, embodiments of the present disclosure may provide durable seamless replication tools useful for the replication of desired relief patterns on recording media, or data storage substrates, including optical recording media. Replication tools according to exemplary embodiments may include desired relief patterns with features on a micron and/or nanometer scale. Further embodiments of the present disclosure may provide methods and/or apparatus for fabricating such seamless replication tools.

While certain embodiments have been described herein, others may be practiced within the scope of the present disclosure. For example, in addition to the embodiments described previously, a tool sleeve can be affixed to a support insert by suitable adhesives to bond the inner tool surface to the outer surface of a centralized sleeve, brazing or welding, press-fitting, thermal shrink-fitting, etc. Furthermore, while an optical head with a laser inside of a support cylinder has been described, a desired pattern on (or in) photoresist may be recorded by other suitable techniques, including relaying of an optical beam along the direction of the rotation axis of a support cylinder to an assembly which re-directs and focuses the beam on the surface of the photoresist. It is also possible that both rotation and translation can be accomplished by movement of only the light source (either directly or as relayed by mirrors, etc.), or accomplished by rotation and translation of the cylinder only, or various combinations of the movements of the cylinder and the head or laser. Moreover, it will be appreciated that, although certain embodiments have been described herein in the context of imprinting structures on data storage substrates, embodiments of the present disclosure may be used for other applications including, but not limited to, holographic replication, microimprint, and nanoimprint lithography and microscopic printing processes, to name a few examples.

Thus, the invention may be embodied in other specific forms without departing from the spirit thereof. The present embodiments are therefore to be considered in all respects as illustrative and not restrictive, the scope of the invention being indicated by appending claims rather than by the foregoing description, and all changes that come within the meaning and range of equivalency of the claims are therefore intended to be embraced therein.

What is claimed is:

1. A seamless pattern replication tool with a pre-patterned and removable sleeve, the replication tool comprising:
   a removable sleeve having a pre-patterned outer surface defined by a first diameter and an inner surface defined by a second diameter less than the first diameter, the inner surface forming a bore, wherein the sleeve has a height along a longitudinal axis perpendicular to the first and second diameters;

wherein the pre-patterned outer surface includes a pre-formed relief pattern disposed on the outer surface of the sleeve, wherein the relief pattern is seamless; and a mounting fixture for supporting the sleeve in rotation, the mounting fixture including shaft inside of the sleeve, an expandable arbor mounted about the shaft and having an outer diameter, and a support element for fixing the shaft relative to the bore of the sleeve, wherein the sleeve is removable from the fixture upon retraction of the outer diameter of the expandable arbor;

wherein the expandable arbor comprises an elastomeric insert configured for insertion into the bore of the support cylinder and about the shaft; and wherein the mounting fixture comprises:

a compression assembly arranged so as to compress the elastomeric insert in a direction along the longitudinal axis of the support cylinder to expand the insert along the inner diameter of the support cylinder and secure the sleeve relative to the shaft.

2. The tool of claim 1, wherein the compression assembly includes:
   threads on the shaft;
   a pair of thrust washers configured to receive the shaft, one washer at each end of the insert; and
   a pair of compression nuts configured for threaded connection to the threads of the shaft, one compression nut at each end of the sleeve, wherein rotation of each compression nut in one direction tightens the nut against the adjacent thrust washer so as to increase the outer diameter of the elastomeric insert to secure the sleeve to the shaft, and rotation in the opposite direction loosens the nut against the thrust washer so as to decrease the outer diameter of the elastomeric insert to release the sleeve relative to the shaft.

3. The tool of claim 1, wherein the relief pattern includes desired features of micron-scale size.

4. The tool of claim 1, wherein the relief pattern includes features of nanometer-scale size.

5. The tool of claim 1, wherein the mounting fixture comprises a cylinder having an outer surface adapted to the bore of the sleeve to hold the sleeve against rotational movement relative to the mounting fixture.

* * * * *